United States Patent [19]

Mii

[11] Patent Number: 4,984,057
[45] Date of Patent: Jan. 8, 1991

[54] SEMICONDUCTOR ELEMENT STRING STRUCTURE

[76] Inventor: Adam Mii, 3Fl., No. 1, Fu Hsing N. Rd., Taipei, Taiwan

[21] Appl. No.: 558,748

[22] Filed: Jul. 27, 1990

Related U.S. Application Data

[63] Continuation-in-part of Ser. No. 345,414, May 1, 1989, abandoned.

[51] Int. Cl.⁵ .......................................... H01L 23/48
[52] U.S. Cl. ...................................... 357/68; 357/70; 357/65
[58] Field of Search .................. 357/17, 70, 68, 65; 29/827; 340/762

[56] References Cited

U.S. PATENT DOCUMENTS

| | | | |
|---|---|---|---|
| 3,609,475 | 9/1971 | Kaposhilin | 317/234 |
| 3,764,862 | 11/1973 | Jankowski | 317/234 |
| 3,914,786 | 10/1975 | Grossi | 357/68 |
| 4,032,963 | 6/1977 | Thome | 357/72 |
| 4,949,156 | 8/1990 | Mii | 357/68 |

FOREIGN PATENT DOCUMENTS

| | | | |
|---|---|---|---|
| 710983 | 6/1965 | Canada | 357/76 |
| 881579 | 8/1960 | United Kingdom | 357/79 |

Primary Examiner—Andrew J. James
Assistant Examiner—Don Morin
Attorney, Agent, or Firm—Poms, Smith, Lande & Rose

[57] ABSTRACT

A semiconductor element string having a number of semiconductor elements, each of which has the first and second leads mounted on a transverse plate. The first leads are cut off from the transverse plate, when the semiconductor element string is to be mounted on the printed circuit board. The second leads connected to the transverse plate serve as the ground lines for the respective semiconductor elements by bending two distal ends of the transverse plate to be mounted on the printed circuit board. A linking piece is provided crossing over the middle portions of the first and second leads so as to make the whole construction more stable. The second leads are bent into a S-shaped structure. Each second lead and its corresponding first lead are located on a first vertical plane which intersects with a second vertical plane passing through a common longitudinal axis of the semiconductor element string by an angle.

1 Claim, 5 Drawing Sheets

SEMICONDUCTOR ELEMENT STRING STRUCTURE

This is a continuation-in-part application of U.S. patent application No. 07/345,414 now abandoned, filed May 1, 1989.

BACKGROUND OF THE INVENTION

This invention relates to a semiconductor element string structure, and more particularly, to a light emitting diode (LED) string which can be used for a display board or the like. During the manufacture of the LED strings, both leads of a plurality of the LED chips are connected with a transverse plate to form a semiconductor element string. After the LEDs are furnished, one lead of each LED chip is cut off from the transverse plate and another lead is still connected to the transverse plate. Therefore, such an LED string can be conveniently positioned on a printed circuit board in order to increase its assembly rate, while decreasing the number of necessary connections to the printed circuit board, and also simplifying the design of the printed circuit boards.

As is well known in conventional techniques, LEDs have often been formed as a single element. When used to form a large LED display, it is necessary to position all of the LEDs on a circuit board and make necessary electrical connections. However, this arrangement has four major drawbacks:

1. It is very time consuming to assemble the separate LEDs into a large LED display and is therefore, inefficient for use in forming such a display.

2. The circuit board used to position every LED thereon is very complicated in its circuit layout. For example, if there are 400 LEDs on the board, then it is necessary to connect 800 pins into a desired matrix and to align the LEDs in a correct position. The work of the assemblage is obviously difficult and expensive. Moreover, it is very difficult to connect so many pins on a one-layer circuit board, and of course, the cost of manufacturing is greatly increased.

3. All the LEDs cannot be easily aligned with one another. The inappropriate assemblage of LEDs on the board tend to cause the LEDs to misalign with one another.

4. When an LED is damaged, the user has to replace the whole LED dot matrix module including the damaged LED. A simple replacement of the damaged LED is impossible.

It is, therefore, the purpose of this invention to mitigate and/or obviate the above-mentioned drawbacks in the manner set forth in the detailed description of preferred embodiment.

SUMMARY OF THE INVENTION

A primary objective of this invention is to provide a semiconductor element string, in which a plurality of semiconductor elements are made into a semiconductor element string by connecting one lead of each semiconductor element to a transverse plate; therefore, the number of necessary connections to the printed circuit board is greatly decreased when it is desired to mount a large number of the semiconductor elements on the printed circuit board.

Another objective of this invention is to provide a semiconductor element string by which all the semiconductor elements can be easily positioned and neatly aligned.

A further objective of this invention is to provide a semiconductor element string, in which each uncut lead, connected to the transverse plate, is bent to form a substantially S-shaped structure. Each second lead and its corresponding first lead are located on a first vertical plane which intersects with a second vertical plane passing through a common axis of the semiconductor element string by an angle, such that the uncut lead of each LED in a semiconductor element string, wherever it locates on the circuitry board, is readily accessible for repair.

Further objectives and advantages of this invention will become apparent as the following description proceeds, and the features of novelty which characterize the invention will be pointed out with particularity in the claims annexed to and forming a part of this invention.

DETAILED DESCRIPTION OF THE PREFERRED EMBODIMENT

Figure 1:
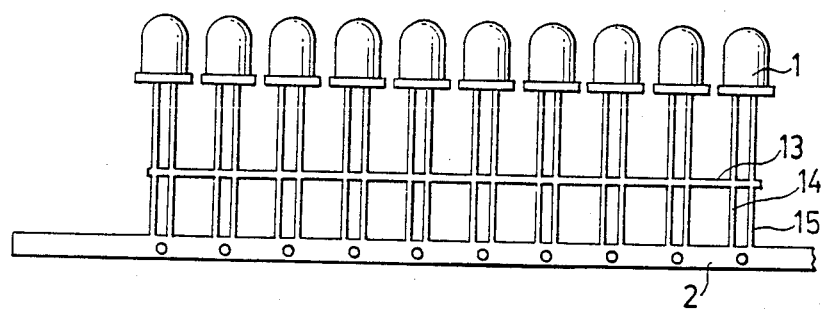
FIG. 1 is a plan view of a semiconductor element string in accordance with the present invention in an original state.

With reference to the drawings and particularly to FIG. 1 thereof, it can be seen that a semiconductor element string structure in accordance with the present invention substantially comprises a plurality of semiconductor elements 1 which have respective first and second leads 14 and 15 electrically connected to a transverse plate 2. Parallel to the transverse plate 2, a linking piece 13 is provided crossing over respective middle portions of the first and second leads 14 and 15 so as to make the whole construction more stable.

Figure 2:
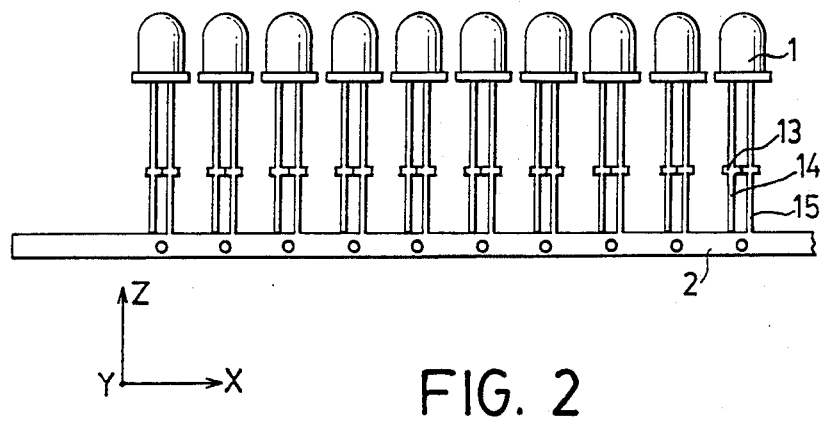
FIG. 2 is a plan view similar to FIG. 1, in which the cutting points for the first lead and the linking piece are illustrated.
Figure 3:
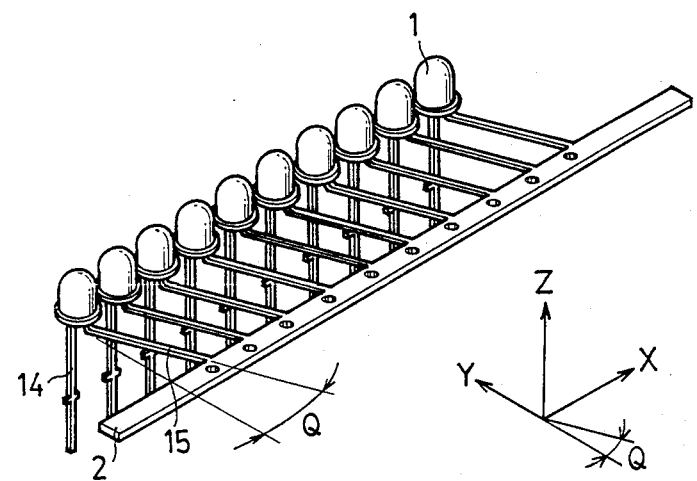
FIG. 3 is a perspective view of the semiconductor element string of FIG. 1, in which the first leads are cut off from the lead frame, and the second leads mounted on the transverse plate are bent by 90 degrees.

When forming the structure of this invention, each first lead 14 is cut off from the transverse plate 2, and the linking piece 13 is cut off from the first and second leads 14 and 15 to isolate the first leads 14 of the semiconductor elements from one another, as shown in FIG. 2. Since the relationship of the parts of the semiconductor element string structure during the bending procedure is not easy to realize from the drawings, coordinate axes is used in FIGS. 2 and 3 to facilitate the understanding of their relative position.

After cutting off the linking piece 13, all of the second leads 15 connected to the transverse plate 2 are bent by 90 degrees to be positioned in the X-Y plane. Moreover, the second leads 15 with the transverse plate 2 are bent in the X-Y plane by an acute angle Q (about 30° to 60°), shown in FIG. 3, to facilitate the assemblage of the first leads 14 on the printed circuit board. Furthermore, this bend provides an easy replacement of a single damaged LED without replacing the whole semiconductor element string, which will be discussed later. It should be noted that the number of the semiconductor elements used to form a semiconductor element string is not exclusive, but is dependent on the actual requirements.

Figure 4:
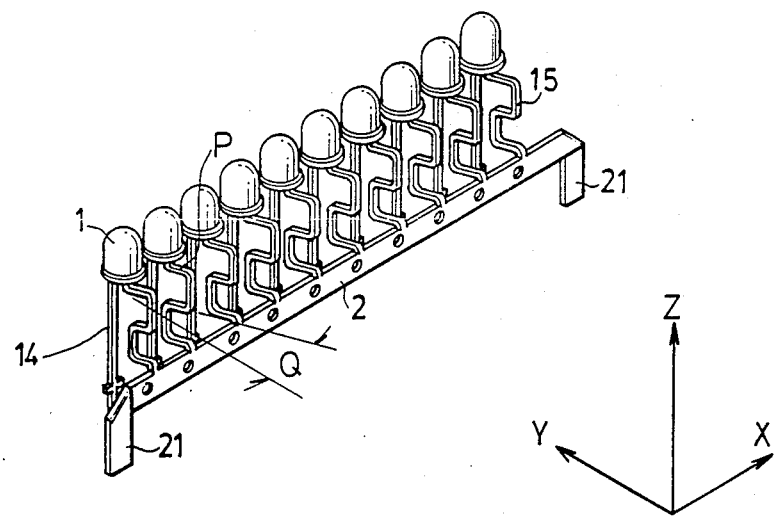
FIG. 4 is a perspective view of the semiconductor element string of FIG. 1, in which the second leads are bent into a S-shaped structure.

All of the second leads 15 are bent into a substantially S-shaped structure to reinforce the structure of the semiconductor element string, as shown in FIG. 4. The second leads 15 connected to the transverse plate 2 serve as the common lines for respective semiconductor elements by bending two distal ends 21 of the transverse plate 2 to be mounted on the printed circuit board. This results in a greatly reduced number of necessary connections to the printed circuit board (i.e., one half of the original number).

Figure 5:
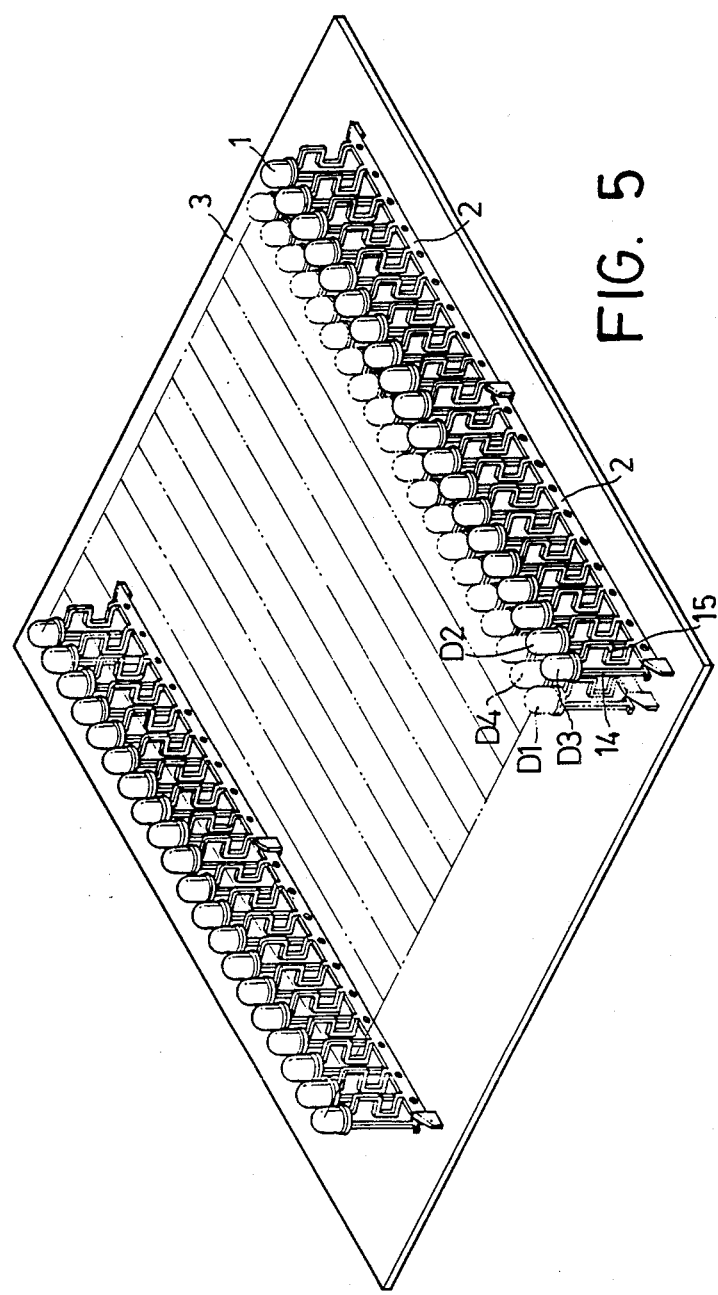
FIG. 5 is a perspective view of a large display, on which a plurality of the semiconductor element strings of the present invention are mounted.

As can be seen in FIG. 5, when mounting the semiconductor element string on the printed circuit board 3, the transverse plate 2 is fixed thereon and causes all the semiconductor elements to be neatly positioned at the same level. Furthermore, the transverse plate 2 also has the effect of further securing the connections of the semiconductor elements on the printed circuit board 3, whereby the large semiconductor element display is formed effectively as well as efficiently. Please note that each end of the transverse plate 2 can be bent inward or outward, so that two or more semiconductor element strings can be aligned with each other.

Figure 6:
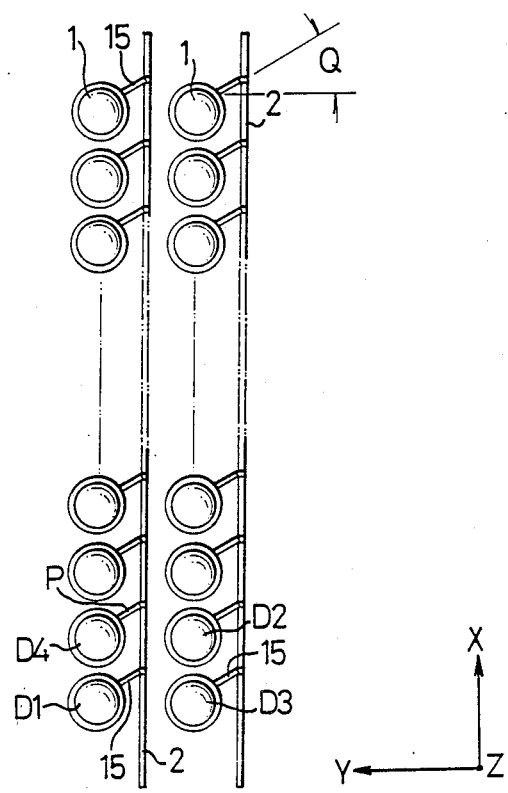
FIG. 6 is a schematic top plan view showing the location of the uncut leads of LEDs according to the present invention.

Referring to FIGS. 4 through 6, the common vertical plane, in which each uncut lead 15 and its corresponding cut lead 14 locate, intersects with a X-Z plane by an angle Q. As shown in FIG. 6, the LEDs are arranged in a manner that the extension line of the lead 15 of an LED D1 in the second row of the semiconductor element string is substantially between the two LEDs D2 and D3 in the first row of the semiconductor element string.

An advantage of this arrangement is that each uncut lead of the LEDs in the semiconductor element string, wherever it locates on the circuit board, is readily accessible for repair. For example, when an LED (for example, LED D4 in FIG. 6) is damaged, the user can sever lead 15 and then lead 14 from a point P, and remove the upper portion of the damaged LED D4, while the lower portion thereof remains on the circuit board. Then, the user severs the two leads of a new LED (not shown) in a place corresponding to the previous severed points on the damaged LED, and then joints the new LED with the above-mentioned lower portion by soldering or other suitable means. Accordingly, the damaged LED is replaced without changing the whole semiconductor element string. Such an arrangement also provides a compact design in the installation of the LEDs on the circuit board. Although the leads 15 of the LEDs are formed in a S-shaped structure which increases the width of each LED, the number of LEDs nevertheless does not decrease since the distance between two rows of LEDs does not increases by means of bending each lead 15 of LEDs about a vertical axis through an angle Q.

As can be seen from the above description, this invention provides a semiconductor element string which not only greatly reduces the time needed for the assembling semiconductor elements into a printed circuit board, but if also significantly simplifies the design of the printed circuit board in connection with the large display. That is, the present invention provides the following advantages:

(1) Provides easier and more convenient fabrication than previously possible since a series of the semiconductor elements are mounted together in actual use;

(2) Simplifies circuit board design by connecting in advance one lead of all the semiconductor elements in a string as the ground line. This results in reducing the number of points required to be soldered and, subsequently, the number of the ground line connections of the printed circuit board for the respective semiconductor elements;

(3) Enhances security of the connections of the semiconductor elements on a printed circuit board, since the semiconductor elements are connected to the transverse plate. This reduces the number of connecting contacts which require inspection;

(4) It is convenient to multiply the amount of the semiconductor element strings by contacting the end portions of the transverse plates; and (5) Each lead of the LEDs which is connected to the transverse plate is of a S-shaped structure and is bent about a vertical axis through an acute angle so as to be readily accessible such that repair is convenient and inexpensive.

Various possible embodiments might be made of the above invention without departing from the scope of the invention; for example, a transistor may be substituted for the light emitting diode. It is to be understood that all matter herein described or shown in the accompanying drawings is to be interpreted as illustrative and not in a limiting sense. Thus it will be appreciated that the drawings are exemplary of a preferred embodiment of the invention and that the scope of the invention is to be limited only by the scope of the appended claims.

I claim:

1. A semiconductor element string comprising a transverse plate, and a plurality of semiconductor elements, each of which has a first lead and a second lead mounted on said transverse plate, said first leads being cut off from said transverse plate when said string is to be mounted on a printed circuit board, said second leads being connected to said transverse plate and serving as ground lines for said respective semiconductor elements by bending two distal ends of said transverse plate to be mounted on said printed circuit board; the improvement comprising:

said second leads are bent into a substantially S-shaped structure to reinforce the structure of said semiconductor element string, each said second lead and its corresponding first lead being located on a first vertical plane which intersects with a second vertical plane passing through a common longitudinal axis of said semiconductor element string by an angle which is not normal to said second vertical plane such that each said second lead of said semiconductor element string is readily accessible for repair.

* * * * *